Figure 1:
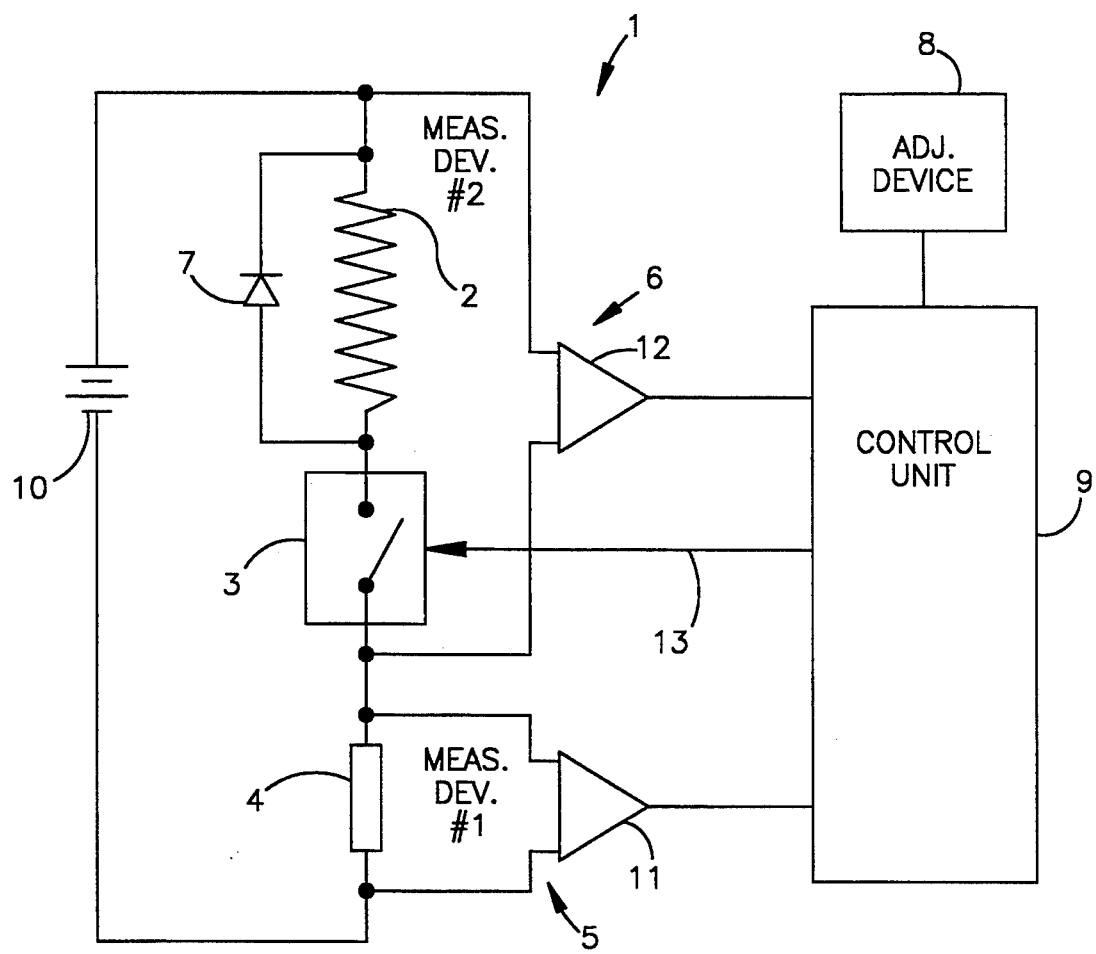

United States Patent [19]
Wallaert

[11] Patent Number: 5,442,515
[45] Date of Patent: Aug. 15, 1995

[54] METHOD AND APPARATUS FOR CONTROLLING THE CURRENT THROUGH A MAGNETIC COIL

[75] Inventor: Johan Wallaert, Assebroek, Belgium

[73] Assignee: Clark Equipment Company, Statesville, N.C.

[21] Appl. No.: 344,526

[22] Filed: Nov. 23, 1994

Related U.S. Application Data

[63] Continuation of Ser. No. 987,761, Dec. 8, 1992, abandoned.

[30] Foreign Application Priority Data

Dec. 10, 1991 [DE] Germany ............... 41 40 586.2

[51] Int. Cl.$^6$ ............... H02H 3/093; H01H 47/32
[52] U.S. Cl. ............... 361/187; 123/490; 323/285
[58] Field of Search ............... 361/79, 153, 154, 160, 361/187, 195; 123/490; 323/222, 285, 286, 287, 299, 351

[56] References Cited

U.S. PATENT DOCUMENTS

| | | | |
|---|---|---|---|
| 4,605,983 | 8/1986 | Harvey | 361/154 |
| 4,736,267 | 4/1988 | Karlmann et al. | 123/490 |
| 4,845,420 | 7/1989 | Oshizawa et al. | 361/153 |
| 5,107,391 | 4/1992 | Siepmann | 361/194 |

Primary Examiner—Peter Ganjoo
Attorney, Agent, or Firm—Watts, Hoffmann, Fisher & Heinke Co.

[57] ABSTRACT

Apparatus and method for controlling current flow through a magnetic coil actuator of a solenoid valve. The current through the magnetic coil is measured by sensing the voltage drop across a precision resistor in series with the coil. The apparatus includes a power switch for alternately switching the coil on and off. A flyback diode is coupled in parallel with the coil for operation during coil shut-off. A first voltage sensor continuously measures the combined voltage drop across the coil and the power switch. A second sensor, coupled across the precision resistor, samples the current flowing through the coil. The samplings occur synchronously with coil turn-on, and are delayed by a predetermined time delay which is long enough to allow the current flowing through the coil to reach steady state before the current is sampled. Circuitry is provided for employing the sensed voltage signal and current samplings to produce a signal whose value is a function of the resistive component of coil impedance. Control circuitry turns the coil on at a fixed frequency. The control circuitry, however, adjusts the duration of the coil turn-on, i.e., the duty cycle, as a function of instantaneous voltage across the combined coil and power switch and also as a function of coil resistance in order to maintain current near a predetermined reference value.

15 Claims, 2 Drawing Sheets

METHOD AND APPARATUS FOR CONTROLLING THE CURRENT THROUGH A MAGNETIC COIL

This application is a continuation of application Ser. No. 07/987,761, filed Dec. 8, 1992, now abandoned.

The invention refers to a method for controling the current through a magnetic coil, in particular that of a solenoid valve, with which the current is measured by means of the voltage drop across a precision resistor wired in series with the magnetic coil, and with which the magnetic coil is switched alternately on and off via a power switch, whereby the magnetic coil is bridged by a flyback diode, and a control apparatus for executing the method. When actuating a valve gate with the aid of a magnetic coil, a relatively large current is needed initially in order to change the position of the valve. Subsequently, a comparatively small current is sufficient to maintain the altered position. This is typically 25% of the current necessary to actuate the valve initially. The invention is particularly concerned with a method for controlling this holding current. If the current through the magnetic coil would not be reduced after the initial actuation of the valve the result would almost certainly be an overheating of the magnetic coil. The resistance of a typical magnetic coil is only a few ohms, while the typical supply voltages are 12 or 24 V. The reduction of the current down to the holding current after the initial actuation of the valve and the keeping the holding current constant are, accordingly, the most important aspects of controlling the current through a magnetic coil.

A method of the type described above is known. Here, the current through the magnetic coil is measured continually and compared with a predetermined reference value. If the measured current is less than the reference value the magnetic coil is switched on, or at least not switched off. If the measured current is greater than the reference value the coil is switched off or, respectively, not switched on. The problem here is that at the desired holding current through the magnetic coil there is only a small voltage drop across the precision resistor. In order that a comparison with the reference value is possible at all, this voltage needs to be tediously amplified. Of course it would be conceivable to raise the resistance value of the precision resistor, whereby however, the power loss would increase in an undesirable manner. A further disadvantage with the known method is that the switching rate, with which the magnetic coil is switched on and off, is usually variable. It is for this reason that electronic devices located in the vicinity during the execution of the method are very difficult to screen from the electromagnetic leakage (stray) fields which occur. The frequency of the electromagnetic leakage fields emitted can be limited in that the magnetic coils are each switched on or off for a minimum period. This minimum period then represents the lower limit for the period of the electromagnetic leakage fields emitted. The specification of a digital reference signal for the reference value is highly desirable but is only possible with a great deal of effort because, as already mentioned, the voltage measured for the current is only low. It is not normally adequate for an analog-to-digital conversion which is to be carried out in real time.

For executing the known method, a control apparatus is known which has an electronic power switch, a precision resistor wired in series with the magnetic coil, a first measurement device for the voltage drop across the precision resistor and a diode wired parallel to the magnetic coil. The diode ensures that the current through the magnetic coil continues flowing after the current is switched off based on the Lenz's Law. In order to be able to continually measure the current through the magnetic coil, the diode is also arranged parallel to the precision resistor. Provided the known method is performed in such a way that the magnetic coils are each switched off for a fixed, predetermined period, it is sufficient to wire the diode exclusively parallel to the magnetic coil. An amplifier is provided for the voltage drop across the precision resistor, and the output signal of said amplifier is fed into the input of a comparator. A reference signal originating from an analog adjusting device is applied to the second input of the comparator. The electronic power switch is switched depending on the output signal from the comparator. A particularly noticeable disadvantage with the known apparatus is the analog adjusting device's dependence on its age, the temperature at the time and the humidity for the reference value. However, the known method and the known apparatus are characterized by a relatively small power loss.

With another known method for controlling the current through a magnetic coil, the current flowing through the magnetic coil is also measured by means of the voltage drop across a precision resistor wired in series with the magnetic coil. This voltage is amplified and compared with a reference signal originating from an analog adjusting device. A transistor wired in series with the magnetic coil is triggered depending on the difference between the actual and the target value. If the current actually flowing through the magnetic coil is very much lower than the reference value, then the resulting resistance of the transistor is only very small. If the current actually flowing through the magnetic coil reaches the desired value or even exceeds it, then the resistance of the transistor is set correspondingly high. This known method is quite clearly a differential control. It is known that a great risk of oscillations is linked to differential controls and that these can put the control out of action. In order to remove this danger, an accurate matching of the individual components of the corresponding control apparatus to the magnetic coil is necessary. One other distinct disadvantage is the high power loss of the control apparatus dropping across the transistor.

It is the object of the invention to demonstrate a method for controling the current through a magnetic coil which can be realized with a small expenditure on equipment, is suitable for currents of different sizes and can be easily adapted to magnetic coils having differing resistances and inductances.

According to the invention this is achieved in that the voltage drop across the magnetic coil and the power switch is measured continuously, that the current is measured punctually when the magnetic coil is switched on, that the current and the voltage, measured simultaneously, are used for determining the coil resistance, and that at a fixed switching rate the magnetic coil is switched on for differing lengths of time depending on the momentary voltage and the latest determination of the coil resistance. With the new method, the current is controlled by measuring the voltage drop across the power switch and the magnetic coil. This is possible because the resistance of the coil was determined beforehand. In this case the coil was switched on continuously so that an accurate current measurement could be carried out with relatively little expenditure on equipment. The voltage drop across the coil and the power switch is always so large that it can be detected without any trouble. The predetermined fixed switching rate with which the coil is switched on and off simplifies the screening of electromagnetic leakage fields which occur. The magnetic coil is switched on for differing lengths of time depending on its resistance and the voltage drop across the magnetic coil, whereby the times are selected so accurately that, on average, the actual value and the desired target value for the current correspond over the time period. A direct check-up on the success does not take place and is not necessary because no deviation of the actual value from the set value can occur when carrying out the method. The absence of a closed control loop is positively remarkable inasmuch as that oscillations of the actual value are excluded from the very outset.

The current can be measured after the magnetic coil has been switched on continuously for a time period of 5 τ, whereby the current through the magnetic coil obeys a time law $$I(t) = I_0(1 - e^{-t/\tau}).$$

After a time of 5 τ, the current through the magnetic coil has reached a value which is almost exclusively dependent on the ohmic resistance of the magnetic coil (>99%).

The precision resistor can be short-circuited if the current is not being measured at that time. This technique allows the power loss associated with the precision resistor to be limited to the times in which the precision resistor is required actually for the current measurement. Apart from the current measurements, exclusively the power actually required is consumed.

A diode can be wired permanently in parallel with the magnetic coil for providing a current path when the coil is switched-off magnetic coil. When the magnetic coil is switched on voltage is applied to the diode in the reverse biased direction and said diode functions like a infinite resistance.

In order to quickly reduce the current through the magnetic coil, said magnetic coil can be switched off with the branch containing diode being open-circuited. These boundary conditions allow the current flowing through the magnetic coil to be reduced as rapidly as possible.

With a control apparatus for executing the new method and having an electronic power switch, a precision resistor wired in series with the magnetic coil, a first measurement device for the voltage drop across the precision resistor and a diode wired parallel to the magnetic coil, the inventive solution consists of the fact that a second measurement device is provided for the voltage drop across the magnetic coil and the electronic power switch. This second measurement device can be made available with very little effort because the voltage to be measured is relatively large. However, the first measurement device for the voltage drop across the precision resistor can also be arranged more simply in the new apparatus than is the case with the state-of-the-art. With the new apparatus, the voltage drop across the precision resistor is only measured when the coil is completely switched on, i.e. only when said voltage is as large as possible.

A switch can be provided with which the precision resistor may be bypassed. This functions in such a way that a relatively large precision resistor can also be used without causing an excessive power loss in the control apparatus. The construction of the first measurement device is made even easier by this.

The output side of the measurement device can be connected to an analog-to-digital converter, whereby a digital adjusting device is provided for a reference value. With the new control apparatus, the voltages tapped off by the measurement devices are so large that an analog-to-digital conversion is also possible in real time without any trouble.

Advantageously, the reference value may, therefore, be predetermined by means of a digital adjusting device.

A multiplexor can be provided between the analog-to-digital converter and the measurement devices. In this way it is sufficient to provide just one analog-to-digital converter for both measurement devices. Doing this, the multiplexor can be triggered together with the precision resistor bypass switch so that the precision resistor is then always short-circuited when no use is being made of the first measurement device.

The suitability of the new method and the new control apparatus for currents of differing sizes and magnetic coils with differing resistances and inductances essentially results in the fact that, using both measurement devices, a multiplicity of information about the coil can be gained and, at the same time, the control exhibits no tendency towards oscillations. The multiplicity of the information gained indeed permits an electronic control unit connected to the measurement device to recognize various magnetic coils by means of a register. This is especially applicable if, for example, the recognition of the progression of the current over a period of time is used.

In the following the invention is explained and described in more detail by means of two embodiment examples. The figures show:

FIG. 1 a circuit diagram of a first embodiment version of the control apparatus

Figure 2:
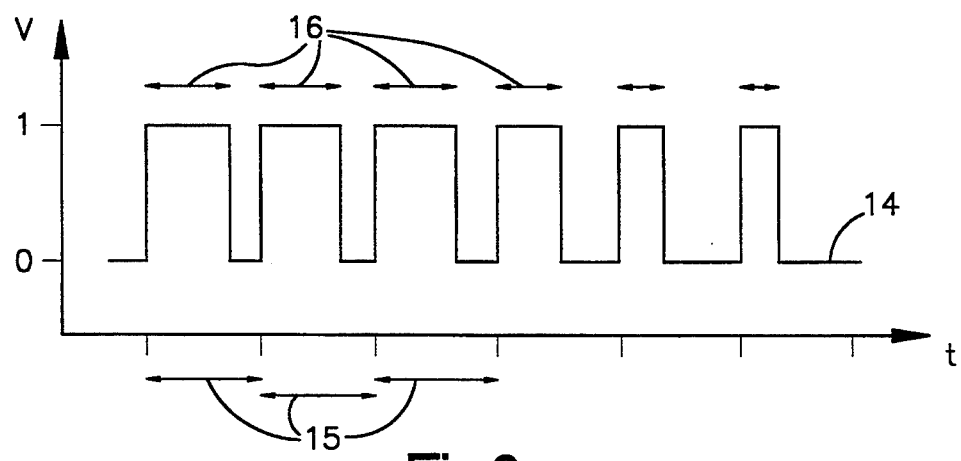
Figure 3:
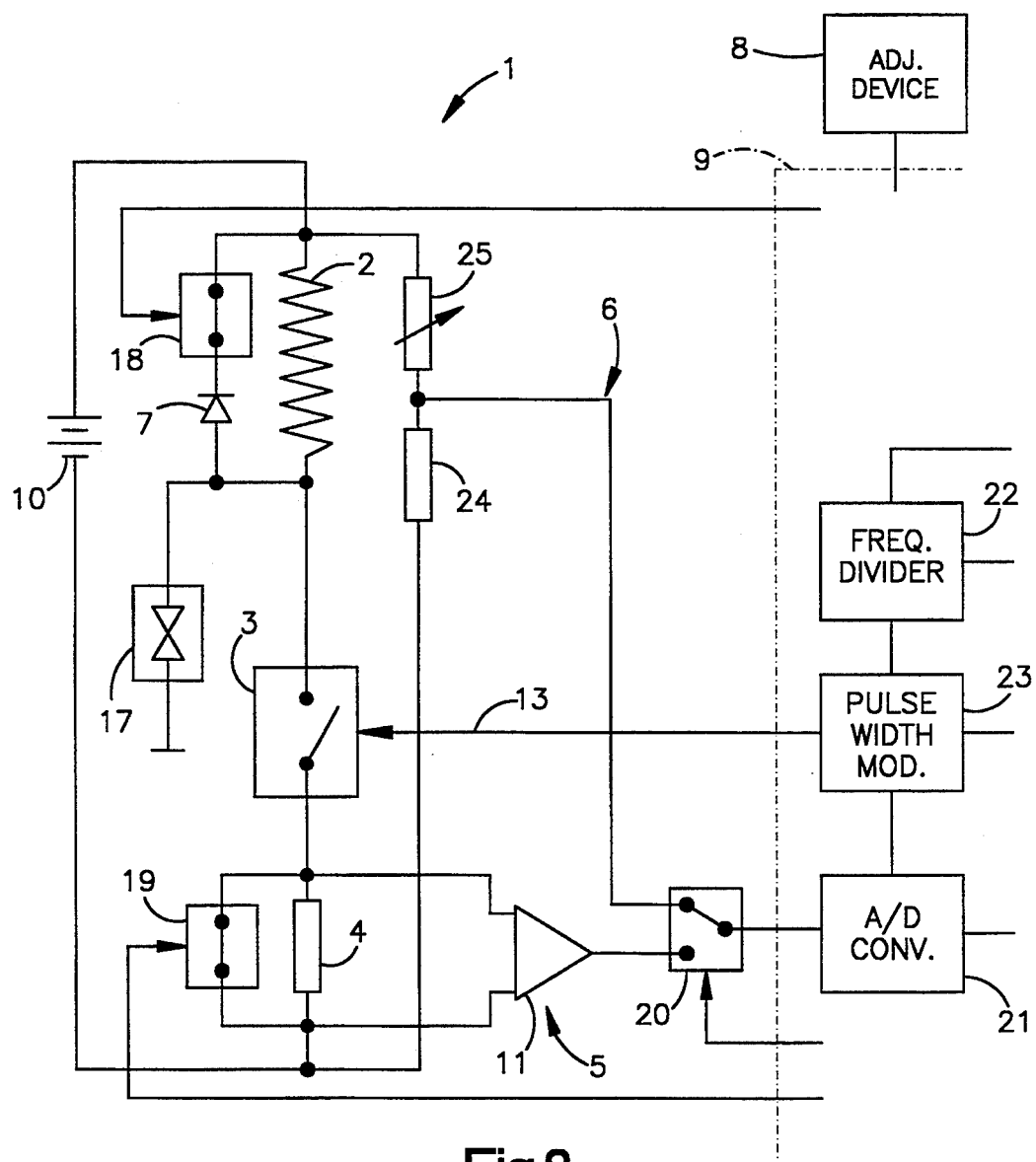
Figure 4:
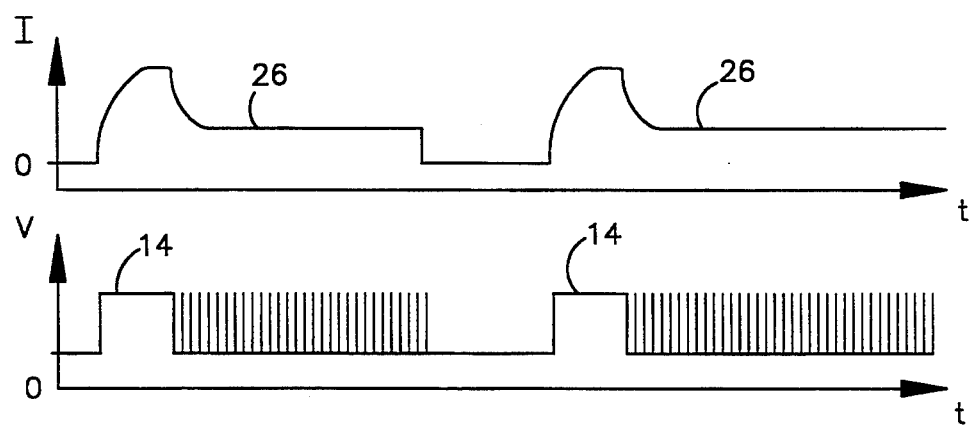

FIG. 2 a switching signal as it occurs in a control apparatus according to FIG. 1, FIG. 3 a second embodiment version of the control apparatus, and FIG. 4 a comparison between a switching signal and the resulting coil current.

The control apparatus 1 for a magnetic coil 2 illustrated in FIG. 1 has an electronic power switch 3, a precision resistor 4 wired in series with the magnetic coil, a first measurement device 5 for the voltage drop across the precision resistor 4, a second measurement device 6 for the voltage drop across the magnetic coil 2 and the power switch 3, and a diode 7 wired parallel to the magnetic coil 2. Further, a digital adjusting device 8 is provided for a reference value as well as a control unit 9. The magnetic coil 2 can be, for example, the magnetic coil of a solenoid valve. In this case a hydraulic valve is actuated with the aid of the magnetic coil. A voltage source 10 is provided for supplying the magnetic coil 2. When the power switch 3 is closed the entire voltage made available by the voltage source 10 drops across the magnetic coil 2 and the precision resistor 4 as well as, of course, the power switch 3. The resistance of the closed power switch 3 is only low, something which is also true for the precision resistor 4, if only to a small extent. Anyway, in essence, the voltage made available by the voltage source 10 drops across the magnetic coil 2. With a closed power switch 3, its resistance becomes infinite so that the entire voltage made available by the voltage source 10 drops across the power switch 3. The first measurement device 5 registers the voltage drop across the precision resistor 4. Since the resistance of the precision resistor 4 is known, measurement of the voltage drop across the resistor permits the determination of the current flowing through the precision resistor 4 and the magnetic coil 2 wired in series with it. In order to limit the power loss, the resistance of the precision resistor 4, as already mentioned, is very low. This results in the voltage registered by the first measurement device being very low. For this reason, the first measurement device has an amplifier 11; a control line to the control unit 9 is provided for the output signal from said amplifier. The voltage to be registered by the second measurement device 6 is markedly greater. It constitutes the difference between the voltage drop across the precision resistor and the voltage made available by the voltage source 10. Accordingly, the second measurement device 6 could also be provided to measure the voltage made available by the voltage source 10. In this case the voltage drop across the precision resistor 4 would be added to the measured value to determine the voltage made available by the voltage source 10. The second measurement device 6 also has an amplifier 12. However, for the reasons mentioned above, this is not absolutely necessary. The output signal from the amplifier 12 is fed via a signalling line to the control unit 9. Besides the output signals from the two measurement devices 5 and 6, the reference or desired coil current value is also fed via the adjusting device 8 to the control unit 9. Based on these three values, the control unit 9 switches the power switch 3 via the control line 13.

The new method for controling the current through the magnetic coil 2 can now be performed as follows. When the power switch 3 is closed the resistance of the magnetic coil 2 is determined. The current through the magnetic coil 2 is determined by means of the voltage drop across the precision resistor 4. The resistance of the resistor 4 is determined by means of the actual voltage drop across the magnetic coil and the power switch 3 and the current through the coil. In the following the magnetic coil 2 is switched on for differing lengths of time by the control unit 9 so that the average current flowing through the magnetic coil over time corresponds exactly to the reference value specified by the adjusting device 8. The following equation form the basis for this:

$$I_{Mean} = (U_{MS}/R_{MS}) \times (t_{ein}/t_{PD}) = I_R.$$

Here, $I_{Mean}$ is the average current flowing through the coil which can be easily set to the reference current value $I_R$ from the voltage drop across the magnetic coil $U_{MS}$, the resistance of the magnetic coil $R_{MS}$, the length of time $t_{ein}$ for which the magnetic coil 2 is switched on each time period $t_{PD}$, and the period of the switching rate $t_{PD}$. For this, the control unit 9 varies the size of $t_{ein}$ in order to match the actual value $I_{Mean}$ to the target value $I_R$.

The switching signal given by the control unit 9 via the control line 13 to the power switch 3 has the shape which is reproduced in FIG. 2. The logical switching signal 14 can take either the value zero or the value one, whereby the value zero corresponds to power switch 3 open and the value one, power switch 3 closed. The magnetic coil 2 is switched on, i.e. the value of the switching signal is set from zero to one, at intervals of length $t_{PD}$ 15. Following this, the magnetic coil 2 remains switched on for differing lengths of time $t_{ein}$ 16, i.e. the value of the switching signal 14 is kept at one. After this, the value of the switching signal 14 is reset to zero and the magnetic coil 2 thus switched off. The switching rate of the switching signal is typically a few kHz. Correspondingly, the period $t_{PD}$ 15 has a duration of less than 1 ms. The current through a typical magnetic coil 2 obeys a time law $$I(t) = I_0(1 - e^{-t/\tau})$$

at a constant applied voltage $U_{MS}$, where $\tau$ is greater than 1 ms. Accordingly, the controlled current through the magnetic coil, despite the alternate switching on and off, exhibits an almost constant or, respectively, merely a slight ripple provided a suitable current path (formed by diode 7 connected in parallel with the coil 2) is available when switch 3 is open. In any case, the ripple may be restricted even further by raising the switching rate.

The control apparatus 1 according to FIG. 3 more or less corresponds to the embodiment version according to FIG. 1. However, some components are realized somewhat differently despite having identical functions. Further, the control apparatus 1 in FIG. 3 is supplemented by a number of details. Therefore, an overvoltage protection 17, two short-circuiting switches 18 and 19, and a multiplexor 20 are provided in addition. Apart from that, an analog-to-digital converter 21, a frequency divider 22 and a pulse-width modulator 23 are illustrated as possible components of the control unit 9. The overvoltage protection 17 prevents the destruction of the power switch 3 by an applied voltage which is too high, as is caused, for example, by switching off the current in the magnetic coil 2 while switch 18 is open. The short-circuiting switch 18, wired in series with the diode 7, is normally shut in order to maintain as far as possible the current through the magnetic coil 2 when the power switch 3 is open. However, for quick reduction of the current through the magnetic coil 2, said power switch is opened by the control unit 9. The short-circuiting switch 19 serves to bypass the precision resistor 4 during the times in which no current measurement is being carried out by means of the voltage drop across the precision resistor 4. This allows the power loss of the control apparatus 1 to be minimized. The short-circuiting switch 19 must be opened prior to the actual current measurement for a start-up phase of length 5 $\tau$ because otherwise the current applied to the magnetic coil is reduced abruptly upon opening said switch. Under these circumstances it is not possible to measure the nontime-dependent resistance value of the magnetic coil 2. The multiplexor 20 serves for the reading of the output signals from, alternately, the first measurement device 5 and the second measurement device 6 into the analog-to-digital converter 21. The multiplexor 20 thus replaces a second analog-to-digital converter 21 and an additional input at the control unit 9. The control unit 9 switches the short-circuiting switch 19 and the multiplexor 20 with logical signals, just like the short-circuiting switch 18. In doing this, the short-circuiting switch 19 and the multiplexor 20 are actuated in strict dependence on each other. When the short-circuiting switch 19 is closed, the multiplexor 20 connects the analog-to-digital converter 21 exclusively with the second measurement device 6. This situation is illustrated in FIG. 3. It serves exclusively for the measurement of the voltage drop across the power switch 3 and magnetic coil 2 or, respectively, the voltage made available by the voltage source 10. When the short-circuiting switch 19 is open, the output signal of the second measurement device 6 continues to be coupled to the input of the analog-to-digital converter 21 until the waiting time of 5 $\tau$ is exceeded, then the multiplexor 20 connects the analog-to-digital converter 21 with the first measurement device 5 so that the control unit 9 can read in the nontime-dependent final value of the current through the magnetic coil 2. Therefore, when the short-circuiting switch 19 is closed, the values registered by the control unit 9 are those which are needed for determining the resistance of the magnetic coil 2.

While the first measurement device 5 in this case is absolutely identical with the first measurement device 5 according to FIG. 1, the second measurement device 6 is constructed somewhat differently. Hence, the amplifier 12 is omitted because this is not normally necessary. Rather, a voltage divider assembled from two resistors 24 and 25 is provided so that only a part of the voltage actually present across the coil 2, the switch 3 and the resistor 4 results as the output signal of the second measurement device 6. Calibration between the actual voltage and the output signal of the first measurement device 5 is possible through a controlability feature of resistor 25. From FIG. 3, it can be seen that the second measurement device 6 registers, the voltage drop across the magnetic coil 2, the power switch 3 and the precision resistor 4. The voltage drop across the precision resistor 4 is, of course, zero when the short-circuiting switch 19 is closed and can be taken into account so as to measure the voltage drop across the coil 2 and the switch 3 when the short-circuiting switch 19 is open since the voltage drop across the resistor is measured by the first measurement device 5. For this, it is sufficient to know the resistance of the precision resistor 4, which is as well significant for determining the current by means of the voltage drop across the precision resistor 4.

The frequency divider 22 in the control unit 9 converts the oscillation with constant frequency originating from an oscillator into an oscillation with the desired switching rate. The pulse-width modulator 23 sets the pulse width $t_{ein}$ at the oscillation made available by the frequency section with the switching rate. This is carried out according to the equation reproduced above in order to achieve the reference value predetermined by the adjusting device 8 for the current flowing through the magnetic coil 2.

The shape of the current 'I' through the magnetic coil 2 over the time t depending on the switching signal 14 is illustrated in FIG. 4. Here, the switching signal 14 corresponds to the pulsed actuation of a solenoid valve in order to achieve an average flow of oil over the time. At the start of each pulse 26, the current through the magnetic coil 2 is run up (increased) in as short a time as possible in order to actuate the valve. Following this, the current is reduced to a value which is sufficient to hold the valve in the position it has now reached. At the end of each pulse 26, the current through the magnetic coil 2 is reduced as rapidly as possible to zero in order to release the valve. The valve then returns automatically to its original position. The main application for the new method for controlling the current through the magnetic coil 2 is when the valve is held in its altered position using a relatively small current through the magnetic coil 2. Provided the start phase of each pulse 26 is reached, in order to achieve a stationary current through the magnetic coil 2, the determination of the resistance of the magnetic coil 2 can take place during this. This would be possible with a current progression according to FIG. 4. The sequence of pulses 26 typically exhibits a frequency in the range of some 10 Hz. The mass flow through the solenoid valve is in this case also controlled via the width of the pulse at a fixed frequency. If the maximum throughflow through the solenoid valve is to be utilized, the valve is held continuously in its operating position. Doing this, the current through the magnetic coil 2 is controlled according to the new method. The switching rate used here is normally a few kHz. However, from time to time, the control is interrupted and the current through the magnetic coil 2 is run up to its maximum value. This guarantees that the valve is transferred back into its operating position even if the position changes, for example, caused by a shock. Further, at this time, the opportunity of measuring the resistance of the magnetic coil is possible. A once-only measurement of the resistance is not sufficient because the resistance can alter constantly depending on the respective operating conditions.

I claim:

1. A method for maintaining a non-zero current flow through a coil near a desired value, the coil connected in series with a resistor and with a switch and coupled to an external source of substantially d.c. electrical potential difference to energize the coil, the switch controlling energization of the coil by the external source and being switchable between a closed position permitting energization of the coil and an open position preventing energization of the coil, said method comprising the steps of:

a) measuring a value of a voltage drop across the resistor;

b) measuring a value of a voltage drop across the coil;

c) determining a value of current flow through the coil based on the measured value of resistor voltage drop and a resistance of the resistor;

d) determining a value of resistance of the coil based on the measured value of coil voltage drop and the determined value of current flow through the coil;

e) determining a portion of a predetermined cycle time period during which the switch should closed thereby supplying a pulsed signal to the coil so as to maintain the current flow through the coil near the desired current flow based on the determined values of the current flow through the coil and the coil resistance;

f) alternately opening and closing the switch such that it is closed for the determined portion of each cycle time period to energize the coil; and g) repeating steps a) through f) at predetermined, regular intervals of time so as to determine a revised value for a portion of the predetermined cycle time period during which the switch should be closed and, based on the revised portion of cycle time value, adjusting the opening and closing of the switch such that it is closed for the revised portion of the cycle time to energize the coil.

2. The method of claim 1, wherein:

the steps of measuring the value of the coil voltage drop and measuring the value of the resistor voltage drop are performed in an alternating sequence.

3. The method of claim 1, further comprising the step of:

coupling a low resistance circuit path, including a switch, in parallel with the resistor, the switch being opened prior to measuring the value of the resistor voltage drop and remaining open during the measurement and being closed to bypass said resistor during times when the measurement is complete.

4. The method of claim 1, further comprising the step of:
coupling a circuit branch containing a flyback diode in parallel with the coil, with the forward current flow direction of said flyback diode being toward the external source of electrical potential.

5. The method of claim 4, further comprising the step of:
coupling an overload switch in series with the flyback diode, the overload switch being normally closed and opening when the voltage value across the coil exceeds a preset overload value.

6. The method of claim 1 wherein the step of measuring the value of the voltage drop across the coil includes measuring a value of a voltage drop across the series connected coil and switch.

7. The method of claim 1 wherein the step of measuring a value of a voltage drop across the resistor is delayed a uniform delay time subsequent to a closing of the switch.

8. The method of claim 1 wherein the step of adjusting the opening and closing of the switch based on the revised portion of the cycle time period the switch should be closed takes place at a time other than when either the value of the voltage drop across the resistor or the value of the voltage drop across the coil are being measured.

9. Apparatus and circuitry for maintaining current in a coil near a desired non-zero value, the coil coupled to an external electrical source to energize the coil, said apparatus and circuitry comprising:
a) a power switch connected in series with the coil, the power switch being switchable between an open and closed position, in the closed position permitting energization of the coil by the external electrical source and in the open position preventing energization of the coil by the external electrical source;
b) a resistor connected in series with the coil and said power switch;
c) a first measurement device for measuring a value of a voltage drop across said resistor;
d) a second measurement device for measuring a value of a voltage drop across said coil; and
e) a control device coupled to the first and second measurement devices and the switch and including means for determining a current flow through the coil based on the measured value of the resistor voltage drop and a resistance of the resistor and for determining a resistance of the coil based on the measured value of the coil voltage drop and the current flow through the coil and further including means for opening and closing said switch such that the switch is closed during a portion of a predetermined cycle time period to provide a pulsed signal to maintain the current flow through the coil near the desired current flow value.

10. The apparatus and circuitry of claim 9, further comprising:
a flyback diode connected in parallel with said coil, with the forward direction of said flyback diode facing the positive terminal of said source of electrical potential.

11. The apparatus and circuitry of claim 10, further comprising:
a switch for selectively disconnecting said flyback diode from the coil.

12. The control apparatus and circuitry of claim 9, further comprising:
low resistance circuitry in parallel with the resistor for selectively bypassing said resistor.

13. The control apparatus and circuitry of claim 9, further comprising:
an analog-to-digital convertor selectively coupled to each of said measurement device for digitizing an output of said measurement devices.

14. The control apparatus and circuitry of claim 9, further comprising:
a) a multiplexer coupled to receive an output from each of said first and second measurement devices; and
b) an analog-to-digital convertor coupled to the multiplexer to receive and digitize an output of said multiplexer.

15. A system for maintaining current flow through a coil near a desired non-zero value, said system comprising:
a) a switch connected in series with the coil;
b) a resistor connected in series with the coil and said switch;
c) a source for providing an electrical potential tending to produce current flow through said series connected coil, switch and resistor;
d) a first measurement device coupled across the coil for producing an output signal whose value is a function of a voltage drop across the coil;
e) a second measurement device coupled across the resistor for producing an output signal whose value is a function of a voltage drop across said resistor; and
f) control circuitry comprising:
i) circuitry responsive to said output signals of said first and second measurement devices for determining a current flow through the coil based on the second measurement device output signal and a resistance of the resistor and for determining a resistance of the coil based on the first measurement device output signal and the determined current flow through the coil; and
ii) circuitry for opening and closing said switch for causing pulsed current to flow through said coil, the leading edges of said pulses occurring at intervals uniformly spaced in time, and the duration of said pulses being a function of both the determined current flow through the coil and the resistance of the coil to maintain coil current near the desired value.

* * * * *